Sept. 11, 1951 O. E. WAGENKNECHT ET AL 2,567,585

VERNIER TUNING DIAL

Filed June 30, 1949

OTTO E. WAGENKNECHT
GILBERT E. GUSTAFSON
*INVENTORS.*

BY Francis W. Crotty
THEIR ATTORNEY

Patented Sept. 11, 1951

2,567,585

UNITED STATES PATENT OFFICE 2,567,585

VERNIER TUNING DIAL

Otto E. Wagenknecht, Chicago, and Gilbert E. Gustafson, River Forest, Ill., assignors to Zenith Radio Corporation, a corporation of Illinois Application June 30, 1949, Serial No. 102,352

3 Claims. (Cl. 74—10.8)

This invention relates generally to tuning dials of the vernier type and more particularly to tuning dials for use in television receivers or the like to actuate the tuning mechanism in these receivers.

It is common practice to provide in present-day television receivers a tuning mechanism which, upon actuation, causes various tuned circuits to be selectively switched into the radio-frequency amplifier and first detector stages of the receiver. These circuits are individually pre-tuned and cause the receiver to be selectively tuned to any of a group of predetermined signal channels to effect reception of signals transmitted over any selected channel. This tuning mechanism is usually provided with a ball and detent arrangement, or other suitable device, to insure positive positioning of the mechanism in each of its positions corresponding to the respective signal channels. The tuning mechanism is usually controlled by an actuating dial mechanically coupled to the rotatable tuning shaft of the mechanism through a series of space-consuming reduction gears to provide a desired ratio between dial rotation and shaft rotation so that the mechanism may be operated from one signal channel to another against the action of the ball and detent arrangement without requiring the application of undue rotational force by the operator.

It is an object of the present invention to provide an improved tuning dial for controlling the rotatable tuning shaft of the tuning mechanism of a television receiver or the like, which provides a desired driving ratio between rotation of the dial and rotation of the tuning shaft.

Another object of this invention is to provide an improved tuning dial of the vernier type that is compact in construction and efficient in operation.

Figure 2:
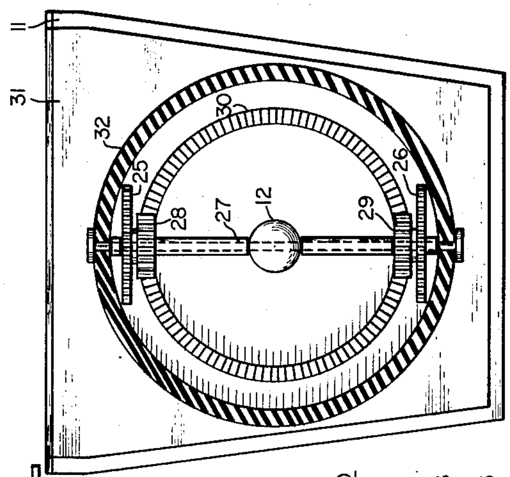
Figure 4:
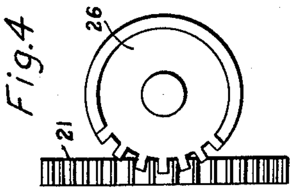
Figure 3:
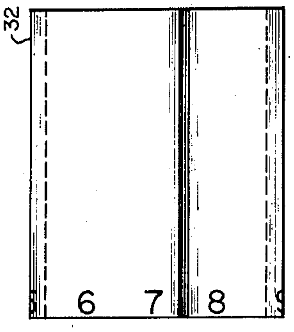
Figure 1:
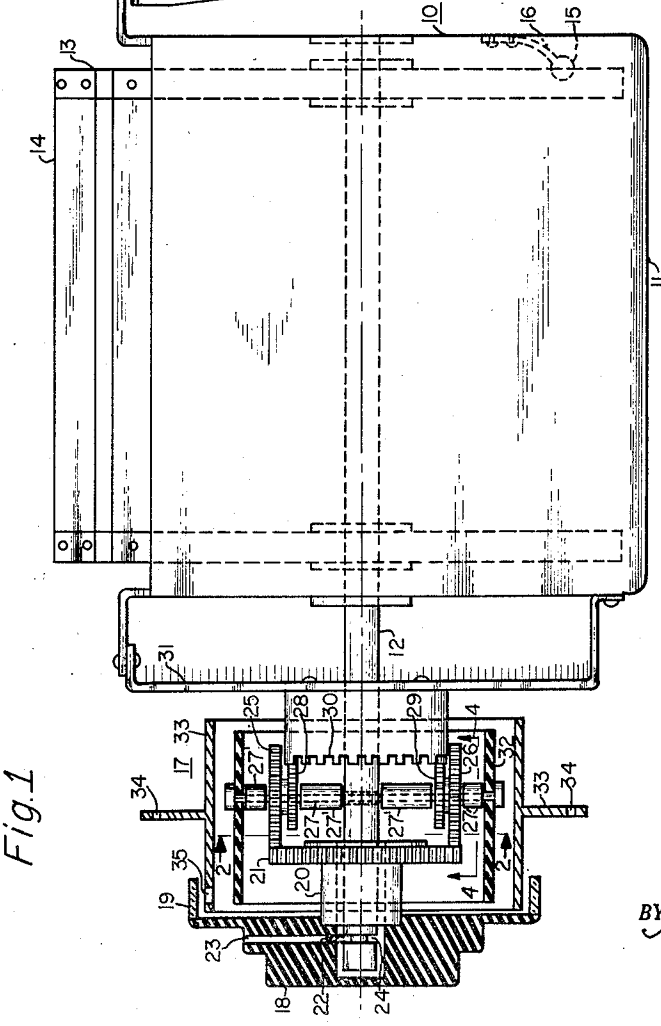

The features of this invention which are believed to be new are set forth with particularity in the appended claims. The invention itself, however, together with further objects and advantages thereof may best be understood by reference to the following description when taken in conjunction with the accompanying drawings, in which:

Figure 1 shows a side elevation, partly in section, of the selector of the present invention, Figure 2 shows a view of the selector taken along the lines 3—3 of Figure 1, Figure 3 shows one of the components of the selector and, Figure 4 shows a view of a portion of the selector taken along the lines 4—4 of Figure 1.

Referring now to Figure 1, the tuning mechanism of a television receiver is designated 10, and in the illustrated example this mechanism is shown in the form of a turret tuner. The turret tuner includes a housing 11, and a tuning shaft 12 mounted thereon and supported for rotational motion thereby. A carriage 13 is mounted on the shaft 12, and supports a plurality of longitudinal strips 14 which carry various circuits pre-tuned to selected frequencies corresponding to the television signals within the tuning range of the receiver. Rotation of the shaft 12 causes the carriage 13 to be rotated and the tuned circuits on the various strips to be selectively connected into the receiver circuit in a manner well understood in the art. Since the particular construction and arrangement of the circuit components of the strips 14 and the particular method of connecting them into the receiver circuit form no part of the present invention, this material has been omitted from the drawing for the sake of simplicity. In order to insure positive positioning of the carriage in each of its pre-selected positions, an arrangement comprising a ball member 15 mounted on a resilient member 16 is provided, this ball member being urged into detents (not shown) in the carriage 13.

The rotation of the tuning shaft 12 and, hence, actuation of the turret tuner 10 is controlled by a dial 17 constructed in accordance with the present invention. The dial 17 comprises an actuating knob 18, constructed of plastic or other suitable material, and the knob 18 includes a cylindrical portion 19 formed of clear transparent plastic. A drum 20 is moulded into the knob 18 coaxially therewith, and has a pinion gear 21 fixed thereto. The actuating knob 18 and drum 20 are rotatably mounted on the tuning shaft 12, and relatively longitudinal movement between the shaft and the knob is prevented by means of a screw 22 threaded into an aperture 23 in the knob and engaging a peripheral slot 24 of the tuning shaft 12.

The gear 21 drives a pair of similar planetary gears 25 and 26 rotatably mounted on a second shaft 27, the second shaft extending through and being supported by the tuning shaft 12 transversely to the axis of the tuning shaft. The planetary gears are held in position on the shaft 27 by means of sleeves 27' surrounding the shaft. The coaction between the planetary gears and gear 21 is represented by Figure 4 which shows the engagement between planetary gear 26 and gear 21. The gears 25 and 26 have a further pair of planetary gears 28 and 29 respectively fixed thereto and driven thereby, these latter gears meshing with a stationary crown gear 30. The crown gear 30 is mounted coaxially with the shaft 12 on a stationary bracket 31 which, in turn, is fixed to the housing 11 of the turret tuner 10. A drum 32 is mounted coaxially with the tuning shaft 12 and supported by the extremities of the second shaft 27 so that rotation of shaft 12 causes similar rotation of the drum 32. A cylindrical member 33 is also mounted coaxially with the shaft 12 and is supported on the receiver panel by means of screws passing through the mounting holes 34, or by other suitable means. The cylindrical member 33 has an aperture 35 formed therein, this aperture being covered by the clear plastic portion 19 of the actuating knob 18. The drum 32 is constructed, preferably, of opaque plastic and has channel-indicating indicia inscribed therein in clear transparent plastic about the periphery thereof to appear selectively under the aperture 35 as the drum rotates. An electric lamp may be placed inside the drum 32 so that the indicia may be illuminated and observed through the clear transparent plastic portion 19 and aperture 35. The electric lamp may be energized continuously while the receiver is in operation without adversely detracting from an observer's enjoyment of the images reproduced by the receiver reproducing device, since the drum 32 and aperture 35 are arranged so that the drum may be viewed only from directly above the dial.

In operation, rotation of the knob 18 causes the pinion 21 to drive the planetary gears 25 and 26 in opposite directions about the shaft 27. The gears 25 and 26, in turn, respectively rotate the gears 28 and 29 and these latter gears, due to their engagement with the stationary crown gear 30, cause the transverse shaft 27 to rotate about the longitudinal axis of the shaft 12, and, therefore cause the shaft 12 to rotate. In addition, the rotation of shaft 27 about the longitudinal axis of the shaft 12 causes the drum 32 similiarly to rotate about this axis whereby the various indicia inscribed about the periphery of the drum appear selectively under the aperture 35. A desired ratio between the rotation of the knob 18 and rotation of the shaft 12 is obtained by proper proportioning of the dimensions of the planetary gears 25, 26 and 28, 29. When desired the gears 28 and 29 may be eliminated and gears 25 and 26 directly coupled to the stationary crown gear 30, to provide a 2:1 ratio between knob and shaft rotation.

Figure 2 shows a further view of the tuning dial and illustrates the manner in which the planetary gears 28 and 29 mesh with the stationary crown gear 30 to cause the second shaft 27 to rotate about the longitudinal axis of the tuning shaft 12 when the planetary gears are driven by pinion gear 21 of Figure 1. As previously described, rotation of the shaft 27 about this axis causes corresponding rotation of the shaft 12 and coaxial drum 32.

Figure 3 shows a view of the coaxial drum 32 having numerals inscribed about its periphery and appropriately positioned so that they will lie under the aperture 35 of the member 33 of Figure 1. These numerals are so arranged that when the actuating knob 18 is rotated to rotate the tuning shaft 12 against the action of the ball 15 and its associated detents these numerals selectively appear under the aperture 35 to indicate the various settings of the turret tuner as determined by the ball and detent arrangement. As previously pointed out, these numerals may be formed of clear transparent plastic so that they may be illuminated by an electric lamp placed within the drum.

It is apparent that the tuning dial of the present invention may be used in other apparatus apart from television receivers, such as radio receivers, car receivers and the like.

This invention provides, therefore, a compact tuning dial for controlling the tuning mechanism of a television receiver or the like in an improved and efficient manner.

While a particular embodiment of the invention has been shown and described modifications may be made therein, and it is intended in the appended claims to cover all such modifications as fall within the true spirit and scope of the invention.

We claim:

1. An indicating and actuating assembly for actuating a rotatable tuning shaft of a tuning mechanism of a television receiver or the like comprising: a pinion gear rotatably mounted in coaxial relation with said tuning shaft; a second shaft extending transversely to the longitudinal axis of said tuning shaft and mechanically coupled thereto for imparting rotational motion to said tuning shaft; a drum having channel-indicating indicia inscribed thereon mounted coaxially with said tuning shaft and supported by the extremities of said second shaft; a stationary crown gear supported coaxially with said tuning shaft; a planetary gear rotatably mounted on said second shaft in meshing engagement with said crown gear and mechanically coupled to said pinion gear to be rotated thereby; and an actuating knob for rotating said pinion gear to cause rotational motion of said second shaft and said drum about the longitudinal axis of said tuning shaft.

2. An indicating and actuating assembly for actuating a rotatable tuning shaft of a tuning mechanism of a television receiver or the like comprising: an actuating knob rotatably mounted on said tuning shaft; a pinion gear fixed to said knob in coaxial relation with said tuning shaft; a second shaft supported by and extending through said tuning shaft transversely to the longitudinal axis thereof; a stationary crown gear supported by said tuning mechanism coaxially with said tuning shaft; a first pair of planetary gears rotatably mounted on said second shaft at opposite extremities thereof in meshing engagement with said crown gear; a second pair of planetary gears rotatably mounted on said second shaft respectively coupled to said first pair and in meshing engagement with said pinion gear; and a drum having channel-indicating indicia inscribed thereon mounted coaxially with said tuning shaft and supported by the extremities of said second shaft.

3. An indicating and actuating assembly for actuating a rotatable tuning shaft of a tuning mechanism of a television receiver or the like comprising: a pinion gear rotatably mounted in coaxial relation with said tuning shaft; a second shaft supported by and extending through said tuning shaft transversely to the longitudinal axis thereof; a drum having channel-indicating indicia inscribed thereon mounted coaxially with said tuning shaft and supported by the extremities of said second shaft; a stationary crown gear supported coaxially with said tuning shaft; a planetary gear system rotatably mounted on said second shaft in meshing engagement with said crown gear and said pinion gear for imparting rotational motion from said pinion to said tuning shaft; a tubular housing mounted coaxially with said drum and having an aperture through which said indicia may be viewed; and an actuating knob for rotating said pinion gear and having a transparent cylindrical portion circumscribing said housing and forming a window over said aperture.

OTTO E. WAGENKNECHT.
GILBERT E. GUSTAFSON.

REFERENCES CITED

The following references are of record in the file of this patent:

UNITED STATES PATENTS

| Number | Name | Date |
|---|---|---|
| 1,392,567 | Horine | Oct. 4, 1921 |
| 1,801,369 | Russon | Apr. 21, 1931 |
| 2,313,183 | Trbojerich | Mar. 9, 1943 |